US008650411B2

(12) United States Patent
Feight et al.

(10) Patent No.: US 8,650,411 B2
(45) Date of Patent: Feb. 11, 2014

(54) ENERGY MANAGEMENT FOR AN ELECTRONIC DEVICE

(75) Inventors: Laurence V. Feight, Island Lake, IL (US); Ryan W. Swartzendruber, Prospective Heights, IL (US)

(73) Assignee: Schweitzer Engineering Laboratories Inc., Pullman, WA (US)

( * ) Notice: Subject to any disclaimer, the term of this patent is extended or adjusted under 35 U.S.C. 154(b) by 317 days.

(21) Appl. No.: 12/497,820

(22) Filed: Jul. 6, 2009

(65) Prior Publication Data

US 2011/0001485 A1    Jan. 6, 2011

Related U.S. Application Data (60) Provisional application No. 61/079,313, filed on Jul. 9, 2008.

(51) Int. Cl.
| | | |
|---|---|---|
| *G06F 1/00* | (2006.01) | |
| *H02J 1/10* | (2006.01) | |
| *H02J 1/00* | (2006.01) | |
| *G05F 1/12* | (2006.01) | |
| *G05F 3/06* | (2006.01) | |
| *H03H 7/48* | (2006.01) | |
| *H01F 17/00* | (2006.01) | |
| *G01R 31/00* | (2006.01) | |
| *H01F 29/00* | (2006.01) | |
| *H01F 38/20* | (2006.01) | |
| *H02M 7/00* | (2006.01) | |
| *G05F 1/33* | (2006.01) | |
| *H02M 5/42* | (2006.01) | |

(52) U.S. Cl.
USPC ............. 713/300; 713/310; 307/43; 307/80; 323/247; 323/309; 323/328; 323/355; 324/500; 336/69; 336/173; 363/64; 363/75; 363/82; 363/90

(58) Field of Classification Search
USPC ............... 713/300, 310; 307/43, 80; 323/247, 323/309, 328, 355; 324/500; 336/69, 173; 363/64, 75, 82, 90
See application file for complete search history.

(56) References Cited

U.S. PATENT DOCUMENTS

| | | | |
|---|---|---|---|
| 3,239,678 A | 3/1966 | Kolm | |
| 5,293,323 A | 3/1994 | Doskocil | |
| 5,608,306 A * | 3/1997 | Rybeck et al. | ............... 320/106 |
| 5,861,684 A | 1/1999 | Slade | |

(Continued)

OTHER PUBLICATIONS

Cooper Power Systems, GrideAdvisor;OutageAdvisor Fault Detection and Location Solution; Increase Reliability, Locate Outages, Shorten Reponse Time, B320-08001, 2008, www.cooperpower.com.

(Continued)

*Primary Examiner* — Stefan Stoynov
(74) *Attorney, Agent, or Firm* — Richard M. Edge (57) ABSTRACT

Energy management of an electronic device using multiple electric power sources. The electric power sources may include a parasitic electric power source, a rechargeable electric power source, an intermittent electric power source, and a continuous electric power source. The electronic device further may include a power supply for receiving the electric power from the source(s) and supplying electric power to the various components of the electronic device that require power. The electronic device may include a source selector for controlling which power source supplies electric power to the power supply. Energy management of the electronic device may be configured to use a permanently exhaustible power source such as a battery only when other power sources are unavailable.

48 Claims, 7 Drawing Sheets

(56) References Cited

U.S. PATENT DOCUMENTS

| | | | |
|---|---|---|---|
| 6,304,176 B1 * | 10/2001 | Discenzo | 340/539.26 |
| 6,657,418 B2 * | 12/2003 | Atherton | 323/282 |
| 6,816,439 B1 | 11/2004 | Kawahara | |
| 7,060,379 B2 | 6/2006 | Speranza | |
| 7,103,786 B2 | 9/2006 | Chen | |
| 7,132,763 B2 | 11/2006 | Rendic | |
| 7,170,194 B2 | 1/2007 | Korcharz | |
| 7,274,168 B2 * | 9/2007 | Tskukamoto et al. | 320/106 |
| 7,315,169 B1 | 1/2008 | Fenske | |
| 7,339,353 B1 | 3/2008 | Masias | |
| 7,382,272 B2 | 6/2008 | Feight | |
| 7,385,374 B2 | 6/2008 | Frantz | |
| 7,411,371 B2 | 8/2008 | Hobbs | |
| 7,667,482 B2 * | 2/2010 | Mort et al. | 324/764.01 |
| 7,948,352 B2 | 5/2011 | Tang | |
| 2001/0054878 A1 | 12/2001 | Odaohhara | |
| 2003/0020332 A1 | 1/2003 | Giannopoulos | |
| 2003/0111908 A1 | 6/2003 | Christensen | |
| 2004/0036359 A1 | 2/2004 | Griffith | |
| 2004/0078606 A1 | 4/2004 | Chen | |
| 2004/0256915 A1 | 12/2004 | Phinney | |
| 2005/0006956 A1 | 1/2005 | Shi | |
| 2005/0253560 A1 | 11/2005 | Popescu-Stanesti | |
| 2007/0269219 A1 | 11/2007 | Teller | |
| 2008/0122518 A1 | 5/2008 | Besser | |
| 2008/0174278 A1 | 7/2008 | Masias | |

OTHER PUBLICATIONS

Cooper Power Systems, GridAdvisor;OutageAdvisor Fault Detection and Location Solution; Cellular Communications, B320-08002, 2008, www.cooperpower.com.

Cooper Power Systems, GridAdvisor; OutageAdvisor Fault Detection and Location Solution; Sensus FlexNet Communications, B320-08003, 2008, www.cooperpower.com.

Cooper Power Systems, GridAdvisor, Exchange, B320-08004, 2008, www.cooperpower.com.

Cooper Power Systems, GridAdvisor, WebExchange, B320-08005, 2008, www.cooperpower.com.

CYMBET™ Corporation, White Paper: Permanent Power for Wireless Sensors, DOC WP-72-01 rev 1, 2008, www.cymbet.com.

Tollgrade Communications, Inc., LightHouse™ Continuous Grid Intelligence™, 2008, www.tollgrade.com.

University of Michigan, University of Michigan News Service, Michroship sets low-power record with extreme sleep mode, Jun. 13, 2008, http://www.ns.umich.edu/htdocs/releases/print.php?htdocs/releases/plainstory.php?id=661 . . . .

PCT/US2009/049951, Patent Cooperation Treaty International Search Report and Written Opinion of the International Searching Authority, Sep. 3, 2009.

* cited by examiner

ENERGY MANAGEMENT FOR AN ELECTRONIC DEVICE

RELATED APPLICATION

This Application claims priority to U.S. Provisional Application No. 61/079,313, entitled "Energy Management for an Electronic Device" filed 9 Jul. 2008, which is hereby incorporated by reference in its entirety.

TECHNICAL FIELD

This disclosure relates to energy management for electronic devices with multiple power sources. More particularly, this disclosure relates to apparatus, systems and methods for improving energy efficiency and product lifetime where multiple electrical power sources are available.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Various electronic devices and systems require electrical power to perform their functions. To improve convenience, such power-consuming devices often include means for acquiring electrical power from more than one source. Some sources are included in the power-consuming apparatus itself such as a battery. Some sources may be capable of generating and supplying electrical power such as a solar panel, mechanical-electrical generator, piezoelectric generator, and the like. Other sources may include a means capable of transforming available electrical power into the form needed for the power-consuming apparatus such as a computer power supply unit, AC adapter, DC adapter, transformer, and the like. Typically devices include a means to acquire power from a dedicated electric power delivery system using, for example, a standard plug that connects with a standard electrical outlet.

Because electricity provided by dedicated electric power delivery system is fairly reliable, such electronic devices often do not include a secondary power source. However, some electronic devices are designed to be used even when temporarily disconnected from the dedicated electric power delivery system. Such devices often include a rechargeable battery that receives charge while the electronic device is connected to the dedicated electric power delivery system, and provides power to the electronic device when the electronic device is not connected to the electric power delivery system. Such devices are typically designed only to accept electric power within certain parameters such as, for example, at predetermined voltages and/or at predetermined frequencies.

Other electronic devices are designed to function using only power that may be available without an electric power delivery system dedicated to providing electric power to the specific electronic devices. Such electronic devices may be capable of parasitically obtaining electrical power from electric equipment such as electric power conductors near the electronic device or a sensor thereof. Such electronic devices may further be capable of obtaining electric power from equipment to which the electronic device is attached or which the electronic device may be configured to monitor.

One example of such an electronic device is a Faulted Circuit Indicator (FCI) designed to monitor conditions of electric equipment. Some examples of electric equipment that may be monitored include power conductors (power lines, buses, and the like), transformers, capacitor banks, voltage regulators, generators, switches, circuit breakers, reclosers, and the like. Some FCIs are configured to derive electrical power from the monitored equipment using inductive or capacitive coupling to the monitored equipment. For such FCIs, no electric power is available to the FCI for performing its functions when the monitored equipment experiences a fault or other conditions exist that make the parasitically derived electric power unusable (e.g., no load current). Other FCIs include a battery (or are connected to an available external battery provided by the electric utility) and operate using the electric power provided by the battery. For such battery-powered FCIs, once the battery has discharged to a certain point, the FCI is no longer capable of operating on the electric power provided thereby.

In another example, an FCI may perform its monitoring functions using the electric power parasitically derived from the monitored equipment, and perform its indication functions using either an internal or external battery by connecting the battery to a display (such as a light emitting diode, "LED"). Once the battery has discharged to a certain point, the FCI is no longer capable of providing the display. Further, the monitoring functions cannot operate when the monitored equipment experiences a fault or other conditions exist that make the parasitically derived electric power unusable (e.g., no load current).

Various types and functions of FCIs are described in U.S. Pat. Nos. 3,676,740, 3,906,477, 4,063,171, 4,234,847, 4,375,617, 4,438,403, 4,456,873, 4,458,198, 4,495,489, 4,974,329, 5,677,678, 5,889,399, 5,990,674, 6,014,301, 6,016,105, 6,133,723, 6,133,724, 6,429,661, 6,433,698, 6,479,981, 6,734,662, 6,822,576, 6,894,478, 6,949,921, 6,963,197, 7,023,691, 7,053,601, 7,106,048, 7,271,580, and 7,315,169, each of which is herein incorporated by reference in its entirety.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

The electronic devices of the present disclosure include multiple electric power sources and electric power sinks. The present disclosure discusses the intelligent use of the available electric power sources and the intelligent use of electric power sinks based on the available sources so as to maximize the usefulness and lifetime of the electronic device.

Figure 1:
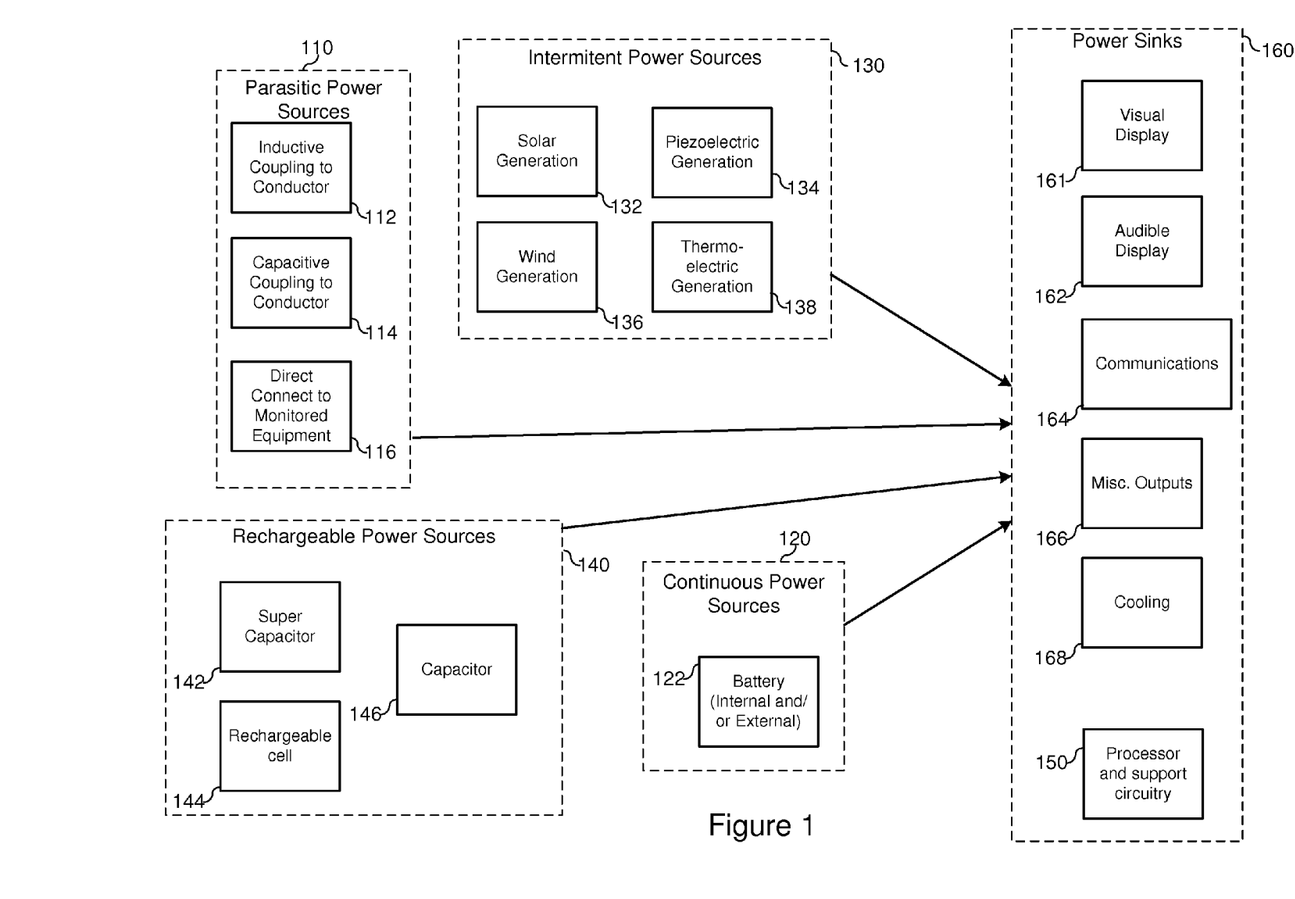
FIG. 1 is a functional block diagram of an electronic device having multiple power sources and sinks.

FIG. 1 illustrates a block diagram of an electronic device with multiple energy sources and energy sinks. The electric power sources are generally categorized into parasitic power sources 110, rechargeable power sources 140, intermittent power sources 130, and continuous power sources 120. The electric power sinks are generally labeled as power sinks 160.

The parasitic power sources 110 include electric power sources that were not designed as a dedicated power source for the electronic device. Inductive coupling to a conductor 112 may include, for example, using the leads from the secondary winding of a current transformer installed on a power line as a power source. Current transformers are often used to obtain a signal that corresponds with the current flowing through an electric conductor. The leads from the secondary winding of a current transformer provide a current proportional to the current flowing in the primary winding (the electric conductor on which the current transformer is installed). The current obtained from the current transformer may, therefore, be used not only to monitor the electric conductor, but also to provide electric power to the electronic device, even though the electric power source (the electric conductor and current flowing therethrough) is not designed for providing electric power to the electronic device. One example of an electronic device that obtains electric power parasitically from an electric conductor by inductive coupling thereto using a current transformer is an FCI such as the one described in U.S. Pat. No. 6,822,576 (to Feight, et. al., entitled Microprocessor Controlled Fault Indicator with Circuit Overload Condition Detection).

Another possible parasitic power source 110 is capacitive coupling to an electric power conductor 114. Capacitive coupling takes advantage of the capacitance between nodes to provide electric energy to an electronic device. Electronic devices may capacitively couple to electric power conductors using, for example, a test point installed on a conductor. At times, these test points are installed on conductors leading to or from electric power transformers, and are used by electronic devices designed to monitor the electric power flowing through the conductor. Capacitive coupling to the conductor is parasitic in that the conductor is not dedicated to deliver power to the electronic device coupled therethrough, yet, the electronic device is capable of obtaining electric power from the conductor using a parasitic coupling. One example of an electronic device that obtains its operating electric power by capacitive coupling is an FCI mounted to a test-point, such as the FCI described in U.S. Pat. No. 5,889,399 (to Schweitzer Jr., entitled Test-Point Mounted Fault Indicator Having Immunity to Fault Currents in Adjacent Conductors).

Yet another example of a parasitic power source 110 is direct connection to monitored equipment 116. Often important and/or expensive pieces of equipment need to be monitored by an additional electronic device. The electronic device may be configured to give an indication as to the condition of the monitored equipment. For example, electric power transformers are often expensive and/or difficult or time-consuming to replace, and are critically important to electric power transmission and distribution. Transformers include a high side where electric power is at a relatively high voltage, and a low side where the electric power is at a relatively low voltage. Electronic devices configured to monitor the current through the transformer are often used to give an indication as to whether the current through the transformer is within predetermined parameters. Such electronic devices may make use of sensors internal to the transformer such as a sensor on the primary winding of the transformer, and obtain electric power from, for example, the low side of the transformer. Such power supply may be considered parasitic in that the transformer is not configured to provide power to the monitoring electronic device, but instead to step the voltage up or down for electric power transmission or distribution purposes.

Another possible power source includes rechargeable power sources 140. Rechargeable power sources 140 include any power source that is capable of receiving a charge and selectively discharging so as to provide electric power to the electronic device.

One example of a rechargeable power source 140 is a rechargeable cell 144. Rechargeable cells 144 are widely known and used for providing electric power to electronic devices. Rechargeable cells 144 are beneficial in that they can provide electric power continuously within known parameters until the charge is depleted, and can accept new charge.

Rechargeable cells 144 often are limited in that they can only provide electric power when operating within certain temperature conditions. That is, rechargeable cells 144 often are only capable of providing electric power at acceptable levels when the temperature of the cell 144 is within a range. Furthermore, rechargeable cells 144 are often limited in that they can only receive an electric charge when the cell 144 is within a certain temperature range.

Lithium-ion and Lithium-polymer batteries are examples of rechargeable cells 144 that are widely used to provide electric power to electronic devices. Lithium-polymer batteries are limited in that they can only provide acceptable electric power at temperatures of from about −20° C. to about 60° C., and accept a charge at temperatures of from about 0° C. to about 45° C. Certain electronic devices are required to operate at conditions well outside of those ranges. FCIs, for example, are often required to operate in temperatures of up to 85° C. and down to −40° C.

Other types of rechargeable batteries may be used. Some other examples of rechargeable batteries that are typically used in electronic devices include Nickel Cadmium, Nickel Metal Hydride, Lithium Iron Phosphate, thin film Lithium-ion, thin film Lithium polymer, and the like. In one example, the rechargeable battery used is a rechargeable thin-film battery such as those available under the trade name EnerChip™ (available from Cymbet corporation, Elk River, Minn.).

Other examples of rechargeable electric power sources 140 include capacitors 146 and supercapacitors (also sometimes referred to as ultracapacitors, electrochemical double layer capacitors, EDLC, and the like) 142. For short-term energy storage, capacitors 146 and supercapcitors 142 are beneficial in electronic devices. Capacitors 146 and supercapacitors 142 have the similar limitations as rechargeable cells 144 in that they operate best within limited temperature ranges, and the desired operating temperature ranges of electronic devices may be outside of the operating temperature ranges of capacitors 146 and supercapacitors 142.

The rechargeable power source may include a regulator configured to provide power to the power supply within acceptable parameters. The regulator may further monitor the rechargeable power source and switch off the rechargeable power source before the rechargeable power source is completely depleted. The regulator may be configured to not allow the rechargeable power source to completely deplete until that power source is needed again. For example, if the rechargeable power source is a supercapacitor, the regulator may allow the supercapacitor to deplete by 50%. If power from the supercapacitor is needed a second time (e.g. for a short-burst RF communication), the regulator will then allow the supercapacitor to completely deplete.

Other electric power sources may include intermittent power sources 130. Intermittent power sources include any electric power sources that are not constant and/or predictable. Some examples of intermittent power sources include solar generation 132 (which relies on solar radiation to produce electric power), wind generation 136 (which relies on wind to produce electric power), piezoelectric generation 134 (which relies on motion to produce electric power), thermo-electric generation 138 (which relies on a thermal gradient to produce electric power), radio frequency ("RF") induction, pyroelectric energy harvesting, and the like. Specific examples of each of these intermittent power sources 130 are known. Electronic devices may include apparatuses such as solar cells, wind turbines, piezoelectric elements, and thermo-electric generators that take advantage of drivers such as solar radiation, wind, motion, and thermal gradients, respectively, to produce electricity. Each intermittent power source 130 is limited in that the driver of each source is not typically constantly available.

Another possible energy source is a continuous power source 120. Continuous power sources 120 include any that is capable of providing uninterrupted electric power to the electronic device through the life of the power source and under the expected operating conditions of the electronic device. One example of a continuous power source 120 is a battery 122 (also referred to as a primary cell). Batteries are often used in electronic devices to continuously provide operating power to the electronic device over wide temperature ranges throughout the life of the battery. Batteries may be internal or external to the electronic device. One example of an electronic device that uses a battery as the electric power source is an FCI such as is described in U.S. Pat. No. 7,315,169 (to Fenske, entitled Microprocessor Controlled Fault Indicator Having Inrush Restraint Circuit). FCIs often include a battery as an internal component to provide continuous electric power to the various components of the FCI. Certain FCIs that are installed in enclosures may be connected to an external battery that may be provided by the electric utility for powering the FCI and/or other electric devices. Batteries are limited in that once they are discharged, they cannot be recharged or supply electric power to the electronic device.

The power sources may include circuitry (such as a regulator) for conditioning the electric power provided thereby. The regulators may also be configured to determine if the power provided is within the parameters required by the particular electronic device that consumes the electric power. The power source may include a supply voltage supervisor configured to flag the processor if the voltage falls below a threshold needed to power the electronic device. The supply voltage supervisor may be integrated into the regulator.

Electronic devices also include electric power sinks 160. Electric power sinks 160 may include any operation, activity, or output of the electronic device that uses electric power. Some examples of electric power sinks 160 include visual displays 161 (such as liquid crystal displays "LCDs", LEDs, monitors, and the like), audible displays 162 (such as speakers and the like), communications 164 (such as radio communications "RF", serial communications, network communications, infrared communications "IR", fiber-optic communications, serial communications, and the like), cooling 168 (such as fans, opening vents, and the like), and miscellaneous outputs 166 (such as tactile outputs, causing heating, causing motion, operating motors, operating actuators, operating solenoids, supplying electric power to another electronic device, and the like), and so forth. Another possible electric power sink 160 is a processor and its support circuitry 150. The processor may include a microprocessor, microcontroller, field programmable gate array (FPGA), application specific integrated circuit (ASIC), and the like, generally referred to as a processor.

The processor may be capable of testing the electric power supplied thereto to determine if the electric power is within acceptable parameters for the electronic device. The processor may include an internal analog-to-digital converter ("A/D"). The A/D may be used to monitor the electric power supplied to the processor to determine whether the power supplied thereto is within acceptable parameters. Further, each power source may include a dedicated supply voltage supervisor integrated circuit that is capable of signaling the processor when the electric power from the specific power source may be unacceptable. Using the output from the A/D, the dedicated supply voltage supervisor integrated circuit, or a signal from the regulators from the various power sources (as discussed above), the processor may affect a change in the power source selected to supply electric power to the electronic device.

As described above, certain FCIs include processors for monitoring the monitored equipment and causing a communication and/or display when a fault is detected. Processors in FCIs may be powered using either a battery or electric power parasitically obtained from the monitored equipment.

As can be seen in FIG. 1, the various power sources are connected to the various power sinks to provide operating power thereto. This arrangement can be accomplished by supplying all operating power to all sinks with a single source, or by supplying all operating power to individual sinks with specific sources. One example of the latter arrangement is described in U.S. Pat. No. 6,479,981 (to Schweitzer, Jr., entitled Remote Light Indication Fault Indicator with a Timed Reset Circuit and a Manual Reset Circuit). This patent describes an FCI wherein the monitoring circuitry obtains operating power parasitically by inductive coupling to the monitored conductor, and the fault indication circuitry (an LED) obtains its operating power from a battery.

Figure 2:
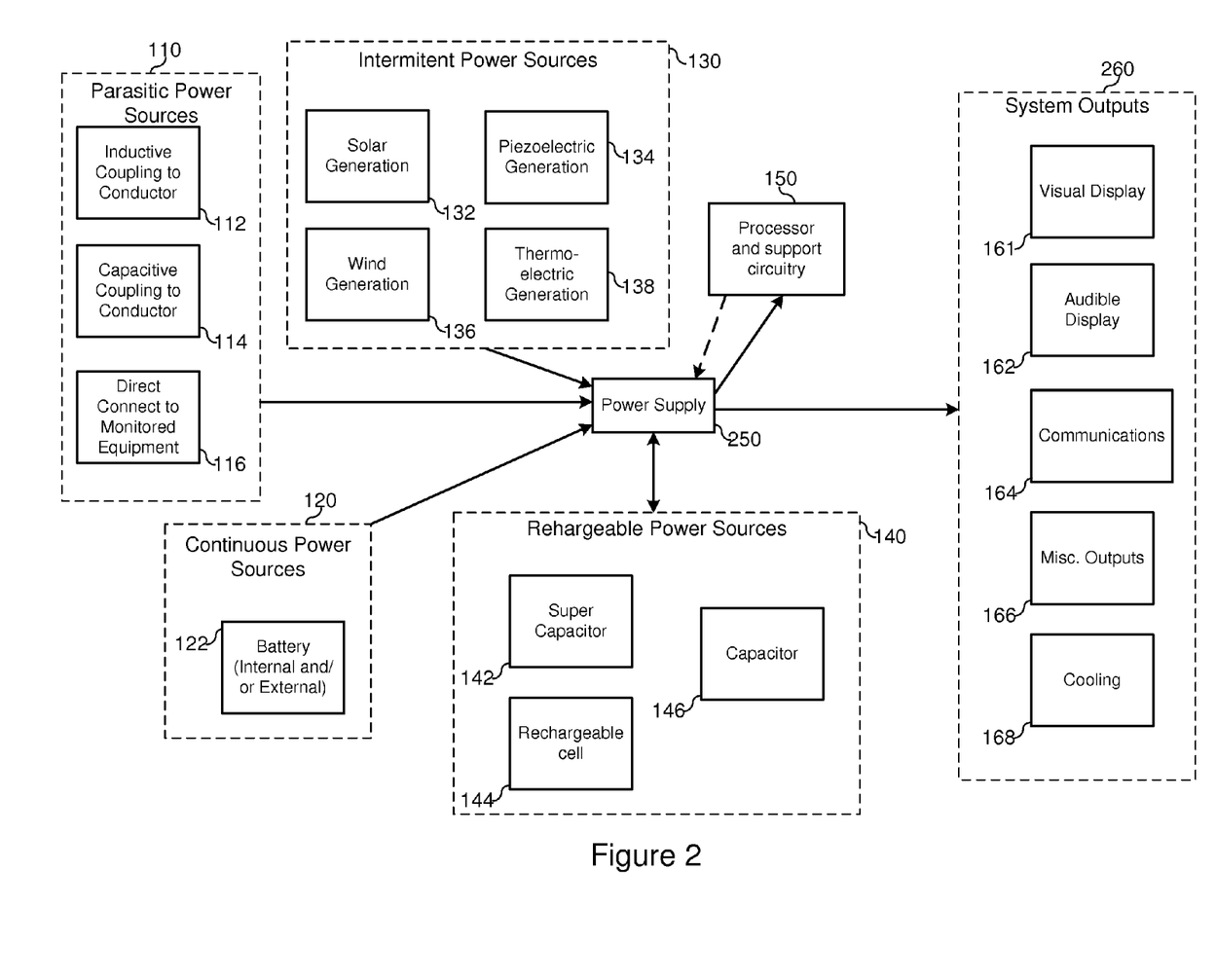
FIG. 2 is a functional block diagram of an electronic device having multiple power sources and sinks and a power supply.

FIG. 2 illustrates a system according to the present disclosure with power sources and sinks; wherein the power flow is conditioned using a power supply 250. As can be seen, the various available power sources are configured to provide electric power to the power supply 250, and the power supply 250 is configured to provide continuous power to the processor 150, system outputs 260, and the rechargeable power sources 140 (if available). The power supply 250 may be controlled by the processor 150 in that the processor 150 may be executing computer instructions for operation of the power supply 250.

Figure 3:
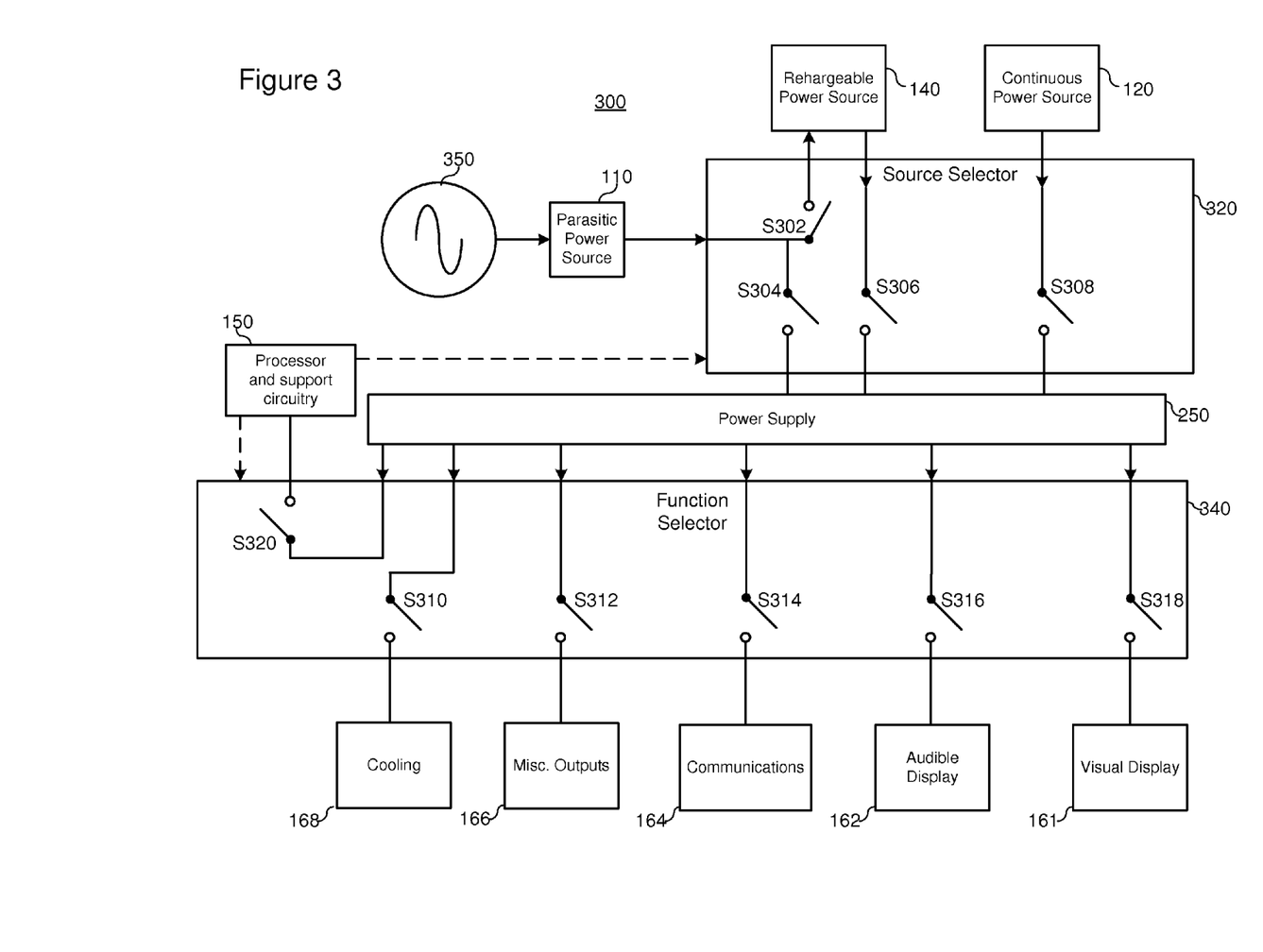
FIG. 3 is a block diagram of an electronic device having multiple power sources and sinks and a power supply.

FIG. 3 illustrates a power flow block diagram of one example of an electronic device 300 including a power supply 250 and various power sources and sinks. As illustrated in FIG. 3, the power supply 250 can receive electric power from one or more of three electric power inputs, namely, from a parasitic power source 110 (e.g. parasitically obtaining electric power from the core of a current transformer 350), a rechargeable power source 140, and a continuous power source 120. Each individual power source may contain the required circuitry as is know in the art to condition the electric power provided thereby to within parameters for voltage, current, frequency (if AC power is to be provided), AC/DC conversion, and the like. If the particular power source is not sufficient to provide power within the parameters, then the regulator of the particular power source may be configured to supply no power.

The power supply 250 includes additional circuitry for conditioning the electric power to remain within specified parameters for the components and functions for which the electric power is intended. Further, the power supply 250 may include circuitry for maintaining a flow of power during switching operations such that power supply is not interrupted as the electronic device 300 switches between particular power sources.

The electronic device 300 includes a source selector 320 for selecting the power source. The source selector 320 may be controlled by the processor 150 (as illustrated), or may include a microcontroller executing computer commands for controlling the selection of power source. The processor may be programmed to conserve the continuous power source 120 as this may be a favored (available along the entire temperature range for which the electronic device is intended for use) and non-rechargeable power source. The source selector 320 may include a series of switches S302, S304, S306, S308 for controlling which power source supplies power to which output. For example, switch S308 may be closed to allow the continuous power source to supply electric power to the electronic device 300. Switch S306 may be closed to allow the rechargeable power source 140 to supply electric power. Finally, switch S304 may be closed to allow the parasitic power source 110 to supply electric power.

Another possible output from the source selector 320 is the rechargeable power source 140, as it requires electric power for charging. Source selector 320 may include switch S302 that, when closed, connects the parasitic power source 110 to the rechargeable power source 140 so as to allow charging of the rechargeable power source 140 from the parasitic power source 110.

As indicated above, the source selector 320 and the various switches therein may be controlled by the microprocessor, which may be running computer instructions configured to increase the reliability of the electronic device by attempting to keep power supplied to the processor 150 and/or the system outputs 260, as well as increase the useful life of the electronic device by choosing rechargeable, parasitic, and intermittent (if available, not illustrated) power sources before permanently exhaustible power sources such as a battery. Turning again to FIG. 3, the processor 150 may be executing computer commands that default to closing switch S304 whenever the electric power supplied by the parasitic power source 110 is available and within acceptable parameters. When the parasitic power source 110 is not available, switch S304 may open, and switch S306 may be closed. If the electric power provided by the rechargeable power source 140 is not available or not within acceptable parameters (for example, if the temperature is below the operating temperature of the rechargeable power source 140), then switch S306 may open, and switch S308 may close. Switch S308 may remain closed until one of the other power sources becomes available and useable.

Further, if electric power from the parasitic power source 110 is available, switch S302 may close such that the rechargeable power source receives electric power from the parasitic power source 110. When available, the parasitic power source 110 can provide electric power to both the rechargeable power source 140 and the remaining components of the electronic device 300.

The electronic device 300 further may include a function selector 340 that includes switches S310-S320 for controlling which power sinks 160 receive operating electric power from the power supply 250. As with the source selector 320, the function selector 340 may be controlled by the processor 150 executing computer commands for the operation thereof (as illustrated), or may include a microcontroller for executing computer commands for controlling the operation thereof. The computer commands executed for controlling the function selector 340 may be configured to preserve useful life of the electronic device 300 by selecting only certain vital power sinks 160 when predetermined power sources are not available. The selection of certain power sinks 160 may be performed by the closing of switches. In particular, switch S310 may be used to control power to the cooling circuitry 168. Switch S312 may be used to control power to miscellaneous outputs 166. Switch S314 may be used to control power to the communications output 164. Switch S316 may be used to control power to the audible display 162. Switch S318 may be used to control power to the visual display 161. Similarly, switch S320 may be used to control power to the processor 150. However, in most situations, power to the processor 150 may be considered vital, and switch S320 may be a fail-closed switch such that if electric power is available, it is supplied to the processor 150.

Additionally, the processor 150 may be configured to alter certain functions of the electronic device 300 when electric power is only available from certain sources. For example, when electric power is only available from a rechargeable or permanently depleatable power source, the electronic device 300 may alter outputs such as display and communication so as to slow the drain on the power source, ultimately prolonging the life of the power source. In one example, the electronic device 300 is an FCI obtaining electric power parasitically from an electric power conductor, and including a rechargeable battery (as the rechargeable power source 140) and a primary cell (as the continuous power source 120). The FCI has a visual display 161 that includes a number of LEDs that flash at a predetermined rate and according to a predetermined pattern when a fault is detected on the electric power conductor by the FCI. When a fault exists on the electric power conductor, the FCI can no longer obtain electric power parasitically, and must switch to either the rechargeable power source 140 or the continuous power source 120. In the event that the rechargeable power source 140 is not available (either it is discharged or the ambient temperature is not within the acceptable operating region), the processor 150 configures the switches such that the continuous power source 120 provides power. The processor 150 is further configured to detect the remaining charge in the continuous power source 120, and alter functions when the remaining charge falls below a predetermined level and/or based on the power source that is supplying power. In this example, the FCI alters the display by slowing the flashing of the LEDs, and/or changing the flashing pattern of the LEDs so as to prolong the useful life of the continuous power source and to indicate to an observer that the continuous power source is nearing its end-of-life. Further reductions and/or changes to functionality are contemplated such as, for example, altered audible display, altered communications duration, altered schedule of communications, altered thresholds on cooling, reduced processor functionality, and the like.

As mentioned above, the processor 150 may be configured to monitor the remaining power in the rechargeable 140 and/or continuous 120 power sources. Some rechargeable and/or continuous power sources include cells that have charge/discharge limitations that can be tracked by the processor 150 using counters. As the number of cycles counted by the processor 150 for a particular cell exceeds a threshold, the cell can be eliminated as a power source choice. The thresholds may be based on an aggregate of cycles occurring within multiple temperature ranges. For electronic devices with multiple continuous and/or rechargeable power sources, the processor may be configured to prefer charging and discharging of cells that are able to tolerate a higher number of charge cycles over charging and discharging of cells that tolerate a lower number of charge cycles. Thus, the processor may be configured to extend the useful life of the electronic device by extending the life of the cells.

Figure 4:
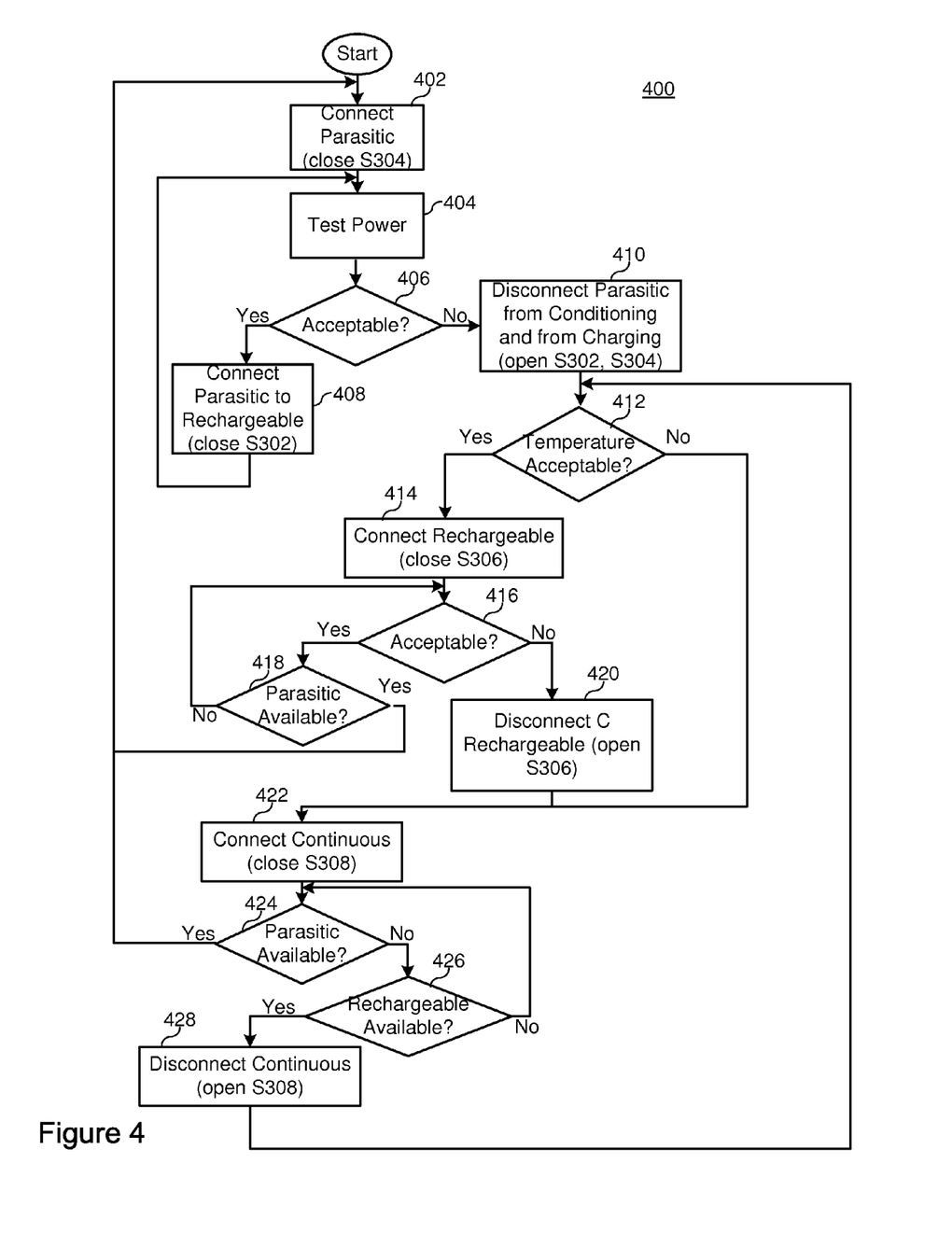
FIG. 4 is a flow chart of a process for using multiple power sources.

FIG. 4 is a flow chart illustrating a method of energy management 400 according to the present disclosure, with specific reference to the block diagram of FIG. 3. This method starts by closing switch S304, thus connecting 402 the parasitic power source to supply electric power to the electronic device. The electric power from the parasitic power source is then tested 404, and a decision is made as to the acceptability of the parasitic power source 406. If the power is acceptable, switch S302 is closed 408 such that the parasitic power source supplies electric power not only to the various components of the electronic device, but also to charge the rechargeable power source.

If the electric power supplied by the parasitic power source is not acceptable, the parasitic power source is disconnected from both the rechargeable power source and the power supply 410 by opening switches S302 and S304, and the temperature is tested 412. If the temperature is within acceptable parameters for the rechargeable power source to supply power, then switch S306 is closed 414, and the rechargeable power source supplies electric power to the various components of the electronic device. If the temperature is not acceptable, then the process proceeds to step 422, detailed below. Though the rechargeable power may be acceptable 416, the process tests to see whether the parasitic power source is available 418 so as to use this external available power source before depleting the rechargeable power source. If the parasitic power source is available, then the process returns to step 402. Otherwise, the process returns to step 416. There may be a time delay or schedule for checking whether the parasitic power source is available 418.

Turning again to step 416, if the rechargeable power source is or becomes unacceptable, then switch S306 is opened 420 disconnecting the rechargeable power source from providing electric power to the various components of the electronic device. Switch S308 is closed 422 to connect the continuous power supply to provide electric power to the various components of the electronic device. As above, the parasitic power source is tested and if available 424, the process returns to step 402. If still not available, the process determines whether the rechargeable power source is available 426. As the rechargeable power source had previously become unavailable, this step may include a determination of whether the temperature has changed into the acceptable range of temperatures for discharging the rechargeable temperature source. If the rechargeable power source has become available 426, then the process opens switch S308 428 disconnecting the continuous power source from supplying power to the various components, and returns to step 412. If the rechargeable power source remains unavailable 426, then the process returns to testing the parasitic power source 424. Again, there may be a time delay and/or schedule for repeating the tests of the various power sources.

The above process is configured to use the parasitic power source whenever it is available and acceptable, and using the continuous power source only when all other power sources are unavailable or unacceptable. Thus, the charge remaining in the primary cell is preserved unless all other power sources are unavailable. It should be noted that other power sources such as the intermittent power source may be included in this process in a similar manner to favor using the continuous power source only when all others are unacceptable. The process could also be modified to favor using the intermittent power source before using the rechargeable power source so as to preserve charge on the rechargeable power source. The process could further be modified so as to allow the intermittent power source to provide charging electric power to the rechargeable power source whenever the intermittent power source is available, regardless of whether the electronic device obtains operating power from the parasitic power source.

The process may also be modified such that switch S302 remains closed indefinitely such that whenever power is available from the parasitic power source 110 and whether or not such power is acceptable for supplying power to the other system components, electric power from the parasitic power source 110 is available to the rechargeable power source 140 for charging of the rechargeable power source. Alternatively, the system and method may check the ambient temperature before closing switch S302 and only close switch S302 if the temperature is within an acceptable range for charging the rechargeable power source 140.

When no power sources are available, the present disclosure may be configured to default to a particular power source such that when that particular power source becomes available, power is again supplied to the processor and other system components. For example, the default may be that in the case where both the rechargeable power source 140 and the continuous power source 120 become unavailable (e.g. the primary and rerechargeable cells are discharged), the method will close switch S304 such that when the parasitic power returns, the power supply 250 can again provide power to the various system components. The system may be capable of selecting no power source.

Further, before the electronic device is commissioned, switch S304 may be closed and all other switches of the source selector opened. Once the parasitic power source becomes available, electric power is supplied to the processor 150, and the electronic device 300 is able to operate as designed. This saves on the lifetime of the continuous power source in that the electronic device is not consuming power thereof before the electronic device is intended to start functioning.

Figure 5:
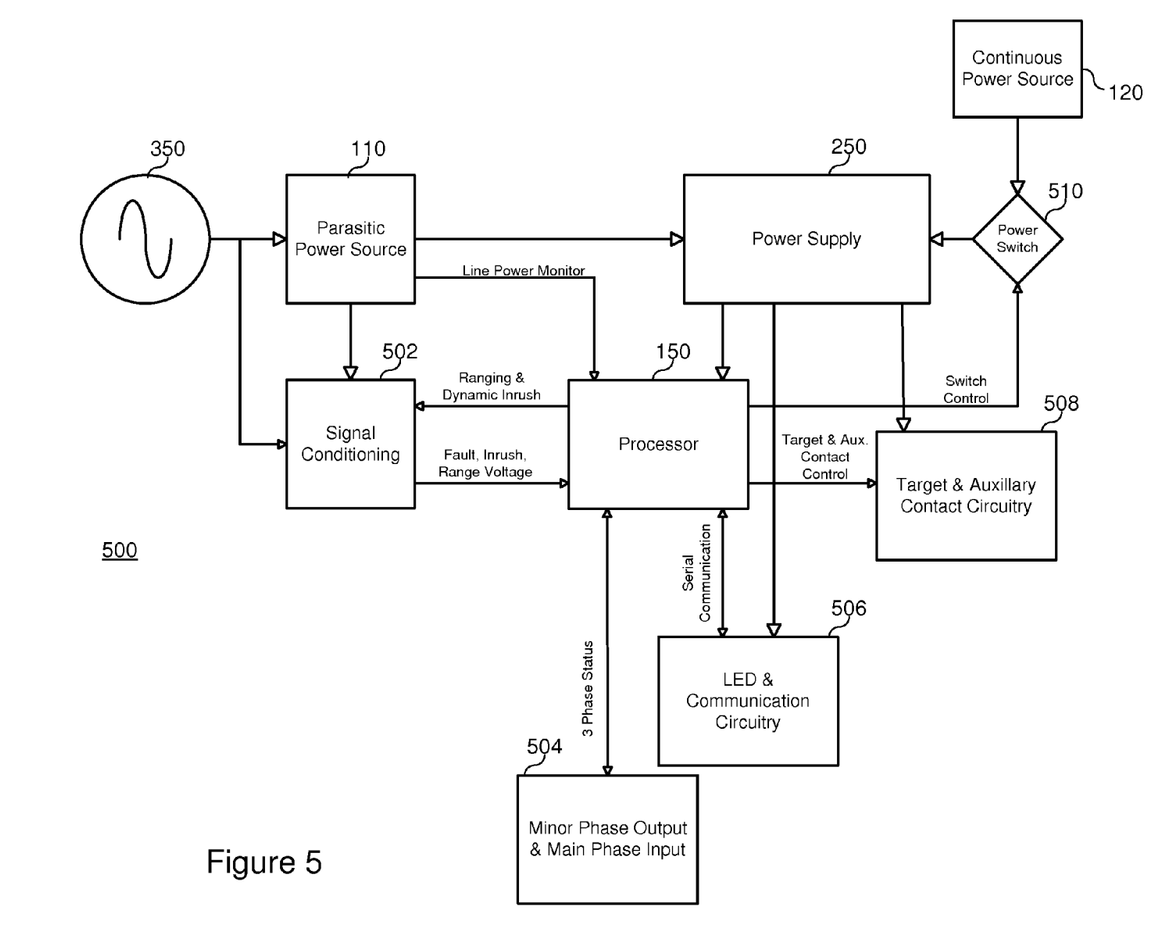
FIG. 5 is a block diagram of a faulted circuit indicator having multiple power sources and sinks.

FIG. 5 illustrates a block diagram of one example of an electronic device, namely an FCI 500, using an energy management system according to the present disclosure. The FCI includes a parasitic power source 110 that obtains power by either capacitive or inductive coupling with an electric power transmission or distribution system operating on an alternating current (AC). For example, the parasitic power source 110 may obtain electric power from the core 350 of a current transformer. As above, the parasitic power source 110 may include conditioning circuitry for conditioning the electric power to within specified parameters, and may supply electric power to the power supply 250, which will in turn supply electric power to other system components.

The continuous power source 120 also is available to supply power to the power supply. The continuous power source 120 may be a battery configured to supply electric power at a wide range of temperatures, such as from about 40° C. to about 85° C., such as, for example, a Tadiran TL-5920 or TL-5903 (available from Tadiran batteries, NY). According to FIG. 5, the battery power switch 510 functions as a source selector, and is controlled by the processor 150. The FCI 500 does not include a source selector for switching a connection from the parasitic power source 110 because it is either available (when no fault is present on the monitored equipment) or it is not (during a fault on the monitored equipment). The power supply 250 supplies electric power to various components of the FCI such as the processor 150, the LED and communication circuitry 506, and the target and auxiliary contact circuitry 508.

An electric power signal from the core 350 is also communicated to signal conditioning circuitry 502 configured to condition the power signal into a form usable by the processor to perform its monitoring functions. The signal conditioning circuitry 502 is only needed when there is a signal on the electric power system to be monitored. The signal conditioning circuitry 502 may be configured to detect loss of signal, i.e. load current dropping below a predetermined level. Thus, the signal conditioning circuitry 502 only needs electric power when electric power from the parasitic power source 110 is also available. As such, the operating power for the signal conditioning circuitry 502 is provided by the parasitic power source 110 instead of by the power supply 250. The signal conditioning circuitry communicates certain data such as power system data, fault, inrush restraint, and ranging voltages to the processor 150. The processor 150 communicates controls such as ranging (selecting the acceptable operating conditions for the monitored equipment) and dynamic inrush restraint controls to the signal conditioning circuitry 502.

The processor 150 further controls other system components. The processor controls the target position and auxiliary contact outputs 508. The target may function as a visual display, as it gives a visual indication as to whether the monitored equipment has experienced a fault. The auxiliary contacts may be used to electronically communicate to another device that a fault has been detected. The processor further controls and communicates with the LED and communication circuitry 506. The LED may function as a further visual display. The communication circuitry may include, for example, RF communications, infrared communications, and the like, configured to communicate concerning the condition of the monitored equipment, operations of the FCI 500, and the like. Further, the processor transmits and receives phase information to and from the minor phase output and main phase input 504.

In one specific embodiment, the communications circuitry includes an RF transceiver for communicating information to a control system such as SCADA or a network. RF communications require relatively high amounts of electric power to operate. Further, the FCI 500 may be configured to execute more communications operations using the RF communications during situations when the parasitic power source 110 is not available (i.e. a fault on the monitored equipment). For example, the FCI 500 may be configured to communicate using RF every 8 hours during non-faulted conditions (where the parasitic power source 110 is most likely to be available). When a fault is detected (when the parasitic power source 110 is least likely to be available), however, the FCI 500 may be configured to communicate using RF immediately upon detection of a fault, and every few minutes thereafter. The FCI 500 may be configured to only use the continuous power source 120 when the parasitic power source 110 is not available, thus preserving the continuous power source 120 for the times when the communication is most necessary.

Another possible miscellaneous output from the power supply may be as a power source to another electronic device. FIG. 5 illustrates that the processor may communicate minor phase output and main phase input 504 to FCIs and/or sources monitoring other power equipment. For example, in a single-phase monitoring scheme of a three-phase power system, an FCI may be monitoring phase A, and be connected to other FCIs or sensors monitoring phases B and C. The status or information from FCIs or sensors on phases B and C may be communicated to the processor using the minor phase output and main phase input 504. Likewise, status or information from A phase may be communicated to FCIs on phases B and/or C using the minor phase output and main phase input 504. It is contemplated that in a similar scheme the power supply of the FCI monitoring phase A may have an output to the FCI monitoring phase B and/or the FCI monitoring phase C as a continuous electric power source. For example, one of the miscellaneous outputs 166 of FIG. 3 may be a power supply to another electronic device. As such, when one phase is faulted the parasitic power source (or other power source) of an FCI monitoring a phase that is not faulted may supply power (via the power supply of that FCI) to the FCI monitoring the phase that is faulted.

Figure 6:
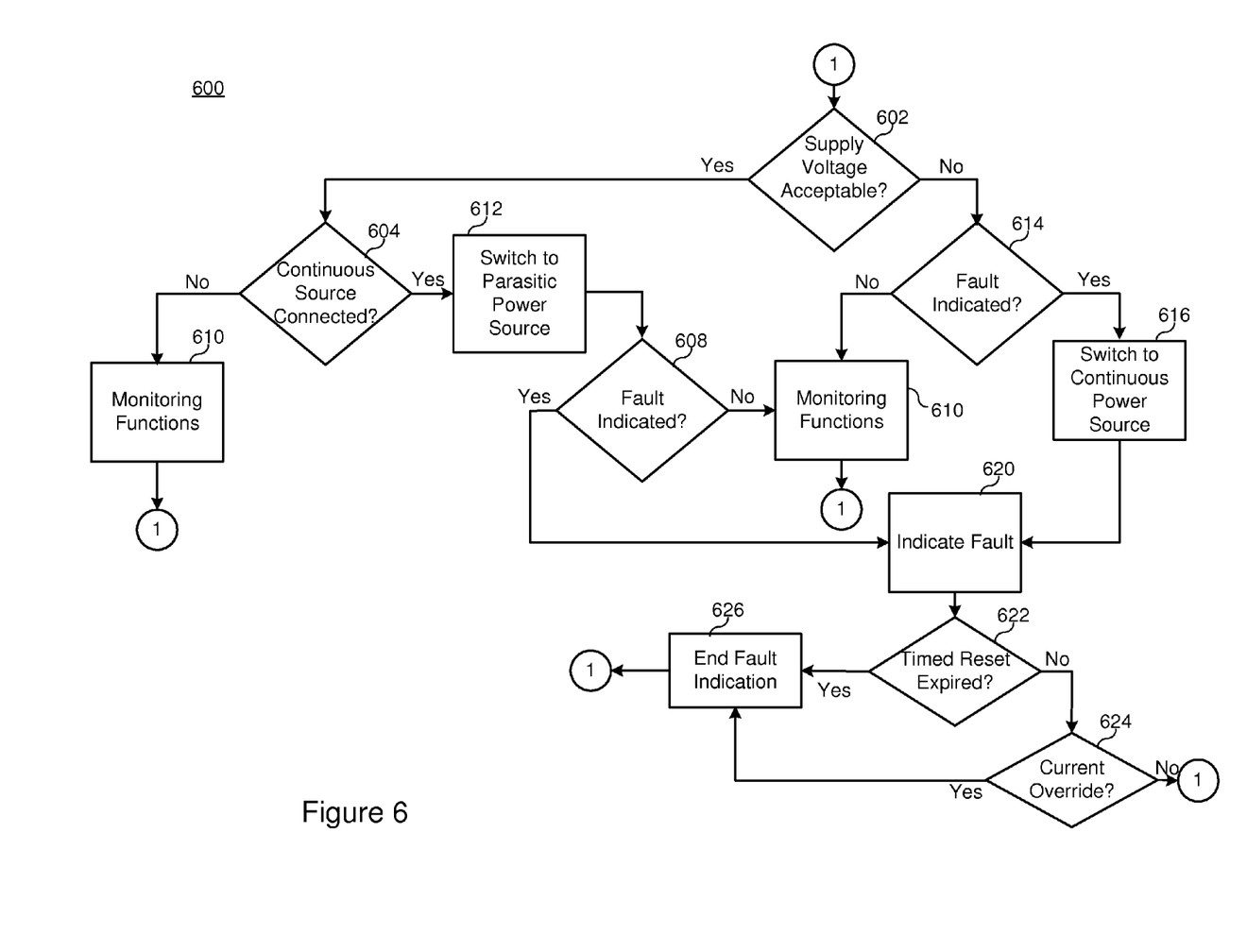
FIG. 6 is a flow chart of a process for using multiple power sources.

One example of a method for energy management as applied to the FCI of FIG. 5 is illustrated in the energy management method 600 of FIG. 6. As indicated above, the FCI 500 may be configured such that the parasitic power source 110 is always connected to the power supply. Thus, the method starts with testing and determining whether the supply voltage is acceptable 602. If the supply voltage is not acceptable, then the method tests whether the monitored equipment is faulted 614. If the equipment is not faulted, then the method performs its typical monitoring, ranging, fault detection, and inrush detection functions 610, and returns to step 602.

If in 614, however, the FCI is indicating the presence of a fault, then the method switches to the continuous power source 616 and provides indication that a fault has occurred 620. As mentioned above, the indication may be RF communications, changing the position of a target indicator, actuating an LED, and the like. The method may then proceed to optional steps concerning the fault indication. For example, the method may test whether a timed reset has expired 622. This step determines whether the indication has been given for the predetermined length of time. If it has, then the method ends the fault indication 626, and returns to step 602. If the timed reset has not expired 622, the method may test whether there has been a current override 624. The current override decision may be included in the method such that if the current in the monitored equipment returns to an acceptable level, then the fault indication no longer needs to be given, in which case, the fault indication is ended 626, and the method returns to step 602. If the current override is either disabled or the current has not returned to acceptable levels, then the method does not end the fault indication, and returns to step 602.

Turning again to step 602, if the supply voltage is acceptable, then the method tests to determine if the continuous electric power source is still connected 604. If not, then the method performs its typical monitoring, ranging, fault detection, and inrush detection functions 610, and returns to step 602. If step 604 determines that the continuous electric power source is connected, then the method switches to the parasitic power source 612, and proceeds to determine if the FCI is indicating the presence of a fault 608. If so, the method continues to step 620 as described above. If not, then the method proceeds to perform its typical monitoring, ranging, fault detection, and inrush detection functions 610, and returns to step 602.

Figure 7:
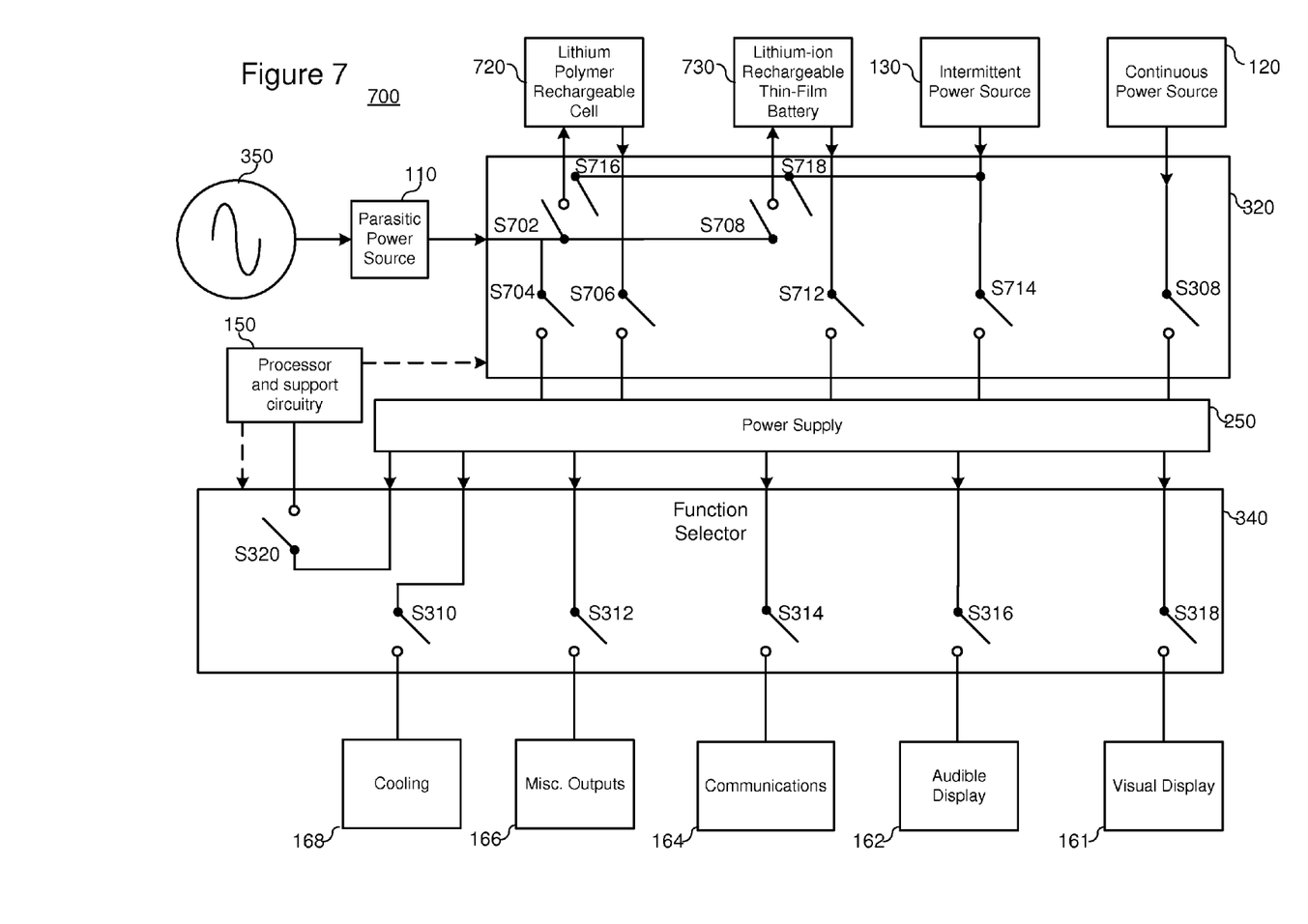
FIG. 7 is a block diagram of an electronic device having multiple power sources and sinks and a power supply.

FIG. 7 illustrates a block diagram of another example of an electronic device 700 having multiple power sources and power sinks in accordance with the present disclosure. As with FIG. 3, this example includes a parasitic power source 110, a continuous power source 120, a source selector 320 controlled by a processor 150, a power supply 250, a function selector 340, and various system outputs and power sinks such as cooling circuitry 168, miscellaneous outputs 166, communications 164, audible display 162, and visual display 161. The electronic device 700 of FIG. 7 also includes two rechargeable power sources, namely a Lithium polymer rechargeable cell 720 and a Lithium-ion rechargeable thin-film battery 730. The electronic device 700 of FIG. 7 also includes an intermittent power source 130 as described hereinabove.

The source selector 320 of FIG. 7 includes several switches for controlling which power source supplies power to the various components of the electronic device 700. Switch S714 may be selectively closed to allow the intermittent power source 130 to supply electric power. Further, switches S716 and S718 may be selectively closed to allow the intermittent power source 130 to supply electric power to the Lithium polymer rechargeable cell 720 and/or the Lithium-ion rechargeable thin-film battery 730, respectively. Switches S702 and S708 may be selectively closed to allow the parasitic power source 110 to supply electric power to the Lithium polymer rechargeable cell 720 and/or the Lithium-ion thin-film battery, respectively. Switches S704, S706, S712, S714, and S308 may be selectively closed to allow the parasitic power source 110, the Lithium polymer rechargeable cell 720, the Lithium-ion rechargeable thin-film battery 730, the intermittent power source 130, and/or the continuous power source 120 to supply electric power to the various components of the electronic device 700.

The electronic device 700 may further be configured to allow different power sources to supply power to different power sinks. Certain of the component and/or functions of the electronic device may require electric power at different parameters than other components, especially during certain events such as a power system fault, or when the parasitic power source 110 is not available. One method to affect such that the power supply 250 may be configured to connect a certain power source to a certain power sink. For example, the electronic device may be configured such that during a power system fault (the parasitic source 110 is not available), switches S712 and S706 may close, along with switches S312, S314, S316, and S318. The power supply may be configured such that when this configuration of switches closes, the power from the Lithium-ion rechargeable thin-film battery may be connected with the communications output 164 (in particular, an RF communications output that requires a short burst of electric power), whereas all other connected outputs are supplied with electric power using the Lithium polymer rechargeable cell.

Another configuration for affecting a similar result as above is to open switches S704, S706, S714, S308, S310, S312, S316, and S318, closing switches S712 and S314 for the short-burst RF communications using the Lithium-ion rechargeable thin-film battery 730. This is followed by closing switches S706, S312, S316, and S318 and opening switches S712 and S314 to allow certain functions of the electronic device using the Lithium polymer rechargeable cell 720. Thus, multiple sources are used for only certain system outputs.

Similarly, the switches and/or power supply 250 may be configured or controlled such that certain of the power sources supply power only to select power sinks, and other of the power sources supply power to other select power sinks. One possible configuration is to keep switches S716 and S718 closed at all times so as to allow the intermittent power source to supply the rechargeable power sources 720 and 730 with electric power for charging whenever possible. This may allow for a "trickle charge" of the rechargeable power sources, thus keeping the charge as high as possible for as long as possible in the rechargeable power sources.

As mentioned above, the processor may be configured to monitor the number of charge/discharge cycles of the Lithium polymer rechargeable cell 720 and the Lithium-ion rechargeable thin-film battery 730 using, for example, a counter. As the thin-film battery 730 may tolerate a higher number of charge/discharge cycles, the processor may be configured to select to charge and discharge the thin-film battery 730 instead of the rechargeable cell 720 when both are available to provide electric power to the electronic device 700.

In one configuration, the processor 150 may be configured to monitor the charge of a rechargeable power source. The processor 150 may then be capable of only allowing the particular rechargeable power source to partially discharge (to provide electric power to the various power sinks) under certain conditions in order to save charge for other conditions. For example, if the electronic device was an FCI, the processor 150 may allow the rechargeable electric power source to discharge to a certain level under non-fault conditions. Thus, when a fault is detected and the parasitic electric power source is not available, the processor 150 would then allow the rechargeable electric power source to completely discharge. Further, the processor may be configured to use a remaining charge of a particular rechargeable power source to provide a burst of electric power for RF communications. In one example, the last 50% of the charge of a supercapacitor may be reserved for a burst of electric power for RF communications under faulted conditions.

Certain methods described herein call for the testing of an electric power source. This may be performed by simply connecting the selected electric power source and determining if the electric power provided thereby is sufficient. This may be alternatively accomplished by connecting a test load (using e.g. a resistor) to the selected power source to determine if it is capable of providing sufficient power.

Other configurations are possible and may be designed so as to extend the useable life of the electronic device and supply the most vital functions of the device with electric power when certain power sources are not available, and are within the scope of this disclosure. For example, in accordance with the present disclosure, an FCI including an intermittent power source and another power source may include a source selector for switching between the intermittent power source and the other power source when the intermittent power source is not available for providing electric power to the FCI. If the other power source is a continuous power source (a battery), then the source selector may be configured to select the intermittent power source whenever available so as to maximize the life of the battery. Further, the intermittent power source may be selected to provide power to certain functions (e.g. radio communications) while the battery provides power to other functions during normal operations so as to maximize the life of the battery. However, when the intermittent power source is not available, the battery may be switched to provide electric power to the functions normally powered using the intermittent power source. Similar configurations are possible for other combinations of power sources.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A power management system for an electronic device, comprising:
    a parasitic electric power source comprising a parasitic electrical connection to an electric power transmission or distribution conductor;
    a rechargeable power source;
    a power supply in electrical communication with the parasitic electric power source and the rechargeable power source for supplying electric power to the electronic device, and,
    a power source selector selecting between the parasitic and rechargable power source for providing electrical power to the electronic device and to control charging of the rechargeable power source;
    a function selector supplying continuous power to a processor, and selecting power sinks for delivery of electric power to the selected power sinks of the electronic device upon availability of the parasitic electric power source;
    wherein the power source selector is configured to select the rechargeable power source to supply electric power only within a first predetermined temperature range.

2. The power management system of claim 1, wherein the parasitic electric power source comprises inductive coupling with the electric power conductor.

3. The power management system of claim 1, wherein the parasitic electric power source comprises capacitive coupling with the electric power conductor.

4. The power management system of claim 1, further comprising a continuous electric power source comprising a battery; and
    wherein the power selector selects the continuous electric power when electric power provided by the parasitic power source and the rechargeable power source are inadequate.

5. The power management system of claim 4, wherein the battery is internal to the electronic device.

6. The power management system of claim 4, wherein the battery is external to the electronic device.

7. The power management system of claim 1, wherein the power source selector is configured to select the parasitic power source unless the electric power provided by the parasitic power source is inadequate.

8. The power management system of claim 1, wherein the rechargeable power source comprises at least one selected from the group consisting of: a rechargeable battery, a capacitor, a supercapacitor, and combinations thereof.

9. The power management system of claim 1, further comprising an intermittent power source selected from the group consisting of: a photovoltaic cell, a thermoelectric generator, a piezoelectric generator, a wind turbine, a pyroelectric generator, and combinations thereof.

10. The system of claim 1, wherein the electronic device comprises a faulted circuit indicator.

11. The system of claim 1, wherein the function selector is configured to disable certain functions performed by the electronic device depending on the power source selected by the power source selector.

12. The system of claim 1, wherein the power source selector is configured to select based on a number of charge/discharge cycles of the rechargeable power source.

13. The power management system of claim 1, wherein the first predetermined temperature range comprises about −20° C. to about 60° C.

14. The power management system of claim 1, wherein the function selector is configured to select the rechargeable power source as a sink for delivery of electric power to charge the rechargeable power source under a second predetermined temperature range.

15. The power management system of claim 14, wherein the second predetermined temperature range comprises about 0° C. to about 45° C.

16. A faulted circuit indicator for monitoring and indicating faults on an electric power conductor, comprising:
    a signal acquisition circuit in communication with the electric power conductor for obtaining a signal from the electric power conductor;
    a microprocessor in communication with the signal acquisition circuit;
    a parasitic electric power source in communication with the electric power conductor for parasitically obtaining electric power from the electric power conductor;
    a continuous electric power source;

a power supply in communication with the parasitic power source and the continuous electric power source for supplying electric power to the microprocessor; and, a function selector supplying continuous power to the microprocessor and selecting power sinks for delivery of electric power to the selected power sinks of the electronic device upon availability of the parasitic electric power source;

wherein the faulted circuit indicator selectively disables a function of the microprocessor and at least one of the selected power sinks when the parasitic electric power supply is unavailable.

17. The faulted circuit indicator of claim 16, wherein the parasitic power source comprises inductive coupling with the electric power conductor.

18. The faulted circuit indicator of claim 16, wherein the parasitic power source comprises capacitive coupling with the electric power conductor.

19. The faulted circuit indicator of claim 16, wherein the continuous electric power source comprises one selected from the group consisting of: an internal battery, an external battery, another electronic device, and combinations thereof.

20. The faulted circuit indicator of claim 16, further comprising a power source selector configured to select between the parasitic and continuous power source for providing electrical power to the microprocessor.

21. The faulted circuit indicator of claim 20, wherein the power source selector is configured to select the parasitic power source unless the electric power provided by the parasitic power source is inadequate.

22. The faulted circuit indicator of claim 20, wherein the power source selector is further configured to select no power source.

23. The faulted circuit indicator of claim 20, wherein the function selector is configured to disable certain functions performed by the electronic device depending on the power source selected by the power source selector.

24. The faulted circuit indicator of claim 20, wherein the faulted circuit indicator is configured to power select functions with select power sources.

25. The faulted circuit indicator of claim 16, further comprising a rechargeable power source.

26. The faulted circuit indicator of claim 25, wherein the rechargeable power source comprises at least one selected from the group consisting of: a rechargeable battery, a capacitor, a supercapacitor, and combinations thereof.

27. The faulted circuit indicator of claim 25, further comprising a power source selector configured to select between the parasitic, rechargeable, and continuous power source for providing electrical power to the electronic device and for controlling charging of the rechargeable power source.

28. The faulted circuit indicator of claim 27, wherein the rechargeable power source comprises a rechargeable battery, and the power source selector is configured to allow charging of the rechargeable battery only under predetermined ambient temperature conditions.

29. The faulted circuit indicator of claim 27, wherein the rechargeable power source comprises a rechargeable battery, and the power source selector is configured to select the rechargeable battery to supply electric power only under predetermined ambient temperature conditions.

30. The faulted circuit indicator of claim 27, wherein the power source selector is configured to select based on a number of charge/discharge cycles of the rechargeable power source.

31. The faulted circuit indicator of claim 16, further comprising an intermittent power source selected from the group consisting of: a photovoltaic cell, a thermoelectric generator, a piezoelectric generator, a wind turbine, a pyroelectric generator, and combinations thereof.

32. The faulted circuit indicator of claim 31, further comprising a power source selector configured to select between the parasitic power source, the continuous power source, and the intermittent power source.

33. A monitoring device for monitoring the status of electrical power equipment, comprising:

a signal acquisition circuit in communication with the electric power equipment for obtaining a signal from the electric power equipment and for detecting a fault condition based on an electric current flow through the electric power equipment;

a microprocessor in communication with the signal acquisition circuit;

a primary power acquisition circuit in electrical communication with the electric power equipment for obtaining electric power from the electric power equipment;

a continuous electric power source;

a fault communication circuit configured to provide one of a visual indication of the fault condition and an audible indication of the fault condition;

a power supply in communication with the primary power acquisition circuit and the continuous electric power source for supplying electric power to the microprocessor;

and, a function selector supplying continuous power to the microprocessor, and selecting power sinks for delivery of electric power to the selected power sinks of the electronic device upon availability of the primary power acquisition circuit;

wherein the function selector is further configured to selectively supply power to the fault communication circuit from the continuous electric power source upon detection of the fault condition by the signal acquisition circuit and unavailability of the primary power acquisition circuit.

34. The monitoring device of claim 33, wherein the electric power equipment comprises a transformer and the primary power acquisition circuit comprises an electrical connection to a low side of the transformer.

35. The monitoring device of claim 34, wherein the signal acquisition circuit is in communication with a high side of the transformer.

36. The monitoring device of claim 33, further comprising a power source selector configured to select between the primary and continuous power sources.

37. The monitoring device of claim 36, wherein the power source selector is configured to select based on the availability of power from the primary and continuous power sources.

38. The monitoring device of claim 36, further comprising a rechargeable power source, and the power source selector is further configured to select among the primary, continuous, and rechargeable power sources.

39. The monitoring device of claim 36, further comprising an intermittent power source, and the power source selector is further configured to select among the primary, continuous, and intermittent power sources.

40. The monitoring device of claim 36, wherein the source selector is configured to select based on an ambient temperature.

41. A power management system for an electronic device, comprising:

an intermittent power source;

a rechargeable continuous electric power source;

a power supply in electrical communication with the intermittent power source and the rechargeable continuous electric power source for supplying electric power to the electronic device;

a power source selector in communication with the intermittent power source, the rechargeable continuous electric power source, and the power supply, for selectively switching between the intermittent power source and the rechargeable continuous electric power source;

a function selector supplying continuous power to a processor, and selecting power sinks for delivery of electric power to the selected power sinks of the electronic device upon availability of the intermittent power source;

wherein the power source selector is configured to select the rechargeable power source to supply electric power only within a first predetermined temperature range.

42. The power management system of claim 41, wherein the electronic device comprises a faulted circuit indicator.

43. The power management system of claim 41, wherein the intermittent power source comprises one selected from the group consisting of: a photovoltaic cell, a thermoelectric generator, a piezoelectric generator, a wind turbine, a pyroelectric generator, and combinations thereof.

44. The power management system of claim 41, wherein the second power source comprises one selected from the group consisting of: a parasitic power source, a rechargeable power source, a continuous power source, and combinations thereof.

45. A power management system for an electronic device, comprising:

a parasitic electric power source comprising a parasitic electrical connection to an electric power transmission or distribution conductor;

a primary cell configured to provide a first source of continuous electrical power;

a rechargeable power source configured to provide a second source of continuous electrical power;

a power supply in electrical communication with the parasitic electric power source, the primary cell, and the rechargeable power source;

a power source selector configured to select between the parasitic electric power source, the primary cell, and the rechargeable power source; and, a function selector configured to selectively provide power to a plurality of power sinks, the function selector further configured to maximize the availability of a continuous supply power to a processor by selectively drawing power:

first from the parasitic electric power source when power from the parasitic electric power source is available;

second from the rechargeable power source when power from the parasitic electric power source is unavailable; and third from the primary cell;

wherein the plurality of power sinks comprise the processor and the rechargeable power source.

46. The power management system of claim 45, further comprising circuitry configured to maintain a flow of power to the processor during a time in which the function selector switches from drawing power from one of the parasitic electric power source, the rechargeable power source, and the primary cell.

47. The power management system of claim 45, wherein the plurality of power sinks further comprise at least one of a visual display and an audible indicator.

48. The power management system of claim 47, wherein at least one of the visual display and the audible indicator are configured to provide an indication of a faulted circuit associated with the electric power transmission or distribution conductor.

* * * * *